United States Patent [19]

Chatterjee et al.

[11] 4,364,076

[45] * Dec. 14, 1982

[54] CO-PLANAR WELL-TYPE CHARGE COUPLED DEVICE WITH ENHANCED STORAGE CAPACITY AND REDUCED LEAKAGE CURRENT

[75] Inventors: Pallab K. Chatterjee, Dallas; Aloysious F. Tasch, Jr., Richardson, both of Tex.

[73] Assignee: Texas Instruments Incorporated, Dallas, Tex.

[*] Notice: The portion of the term of this patent subsequent to Apr. 8, 1997, has been disclaimed.

[21] Appl. No.: 828,080

[22] Filed: Aug. 26, 1977

[51] Int. Cl.³ .................. H01L 29/78; G11C 19/28; G11C 11/34
[52] U.S. Cl. ................. 357/24; 307/221 D; 365/183; 357/91
[58] Field of Search ........... 357/24, 91; 307/221 D; 365/183

[56] References Cited

U.S. PATENT DOCUMENTS

| | | | |
|---|---|---|---|
| 3,660,697 | 5/1972 | Berglund et al. | 357/24 |
| 3,789,267 | 1/1974 | Krambeck et al. | 357/24 |
| 3,796,932 | 3/1974 | Amelio et al. | 357/24 |
| 3,852,799 | 12/1974 | Walden | 357/24 |
| 4,012,759 | 3/1977 | Esser | 357/24 |
| 4,024,514 | 5/1977 | Elmer et al. | 357/24 |
| 4,035,906 | 7/1977 | Tasch et al. | 357/24 |
| 4,047,215 | 9/1977 | Frye et al. | 357/24 |
| 4,060,738 | 11/1977 | Tasch et al. | 357/24 |
| 4,103,347 | 7/1978 | Barton | 307/221 D |
| 4,110,777 | 8/1978 | Esser et al. | 357/24 |

FOREIGN PATENT DOCUMENTS

2504088  8/1975  Fed. Rep. of Germany ........ 357/24

*Primary Examiner*—Gene M. Munson
*Attorney, Agent, or Firm*—William E. Hiller; Melvin Sharp; James T. Comfort

[57] ABSTRACT

A charge coupled device memory is disclosed which includes a plurality of stages having increased charged storage capacity and decreased leakage current. Each stage is comprised of a semiconductor substrate of a first-type conductivity having a first surface. An insulating layer of uniform thickness lies on the first surface. A charge transfer channel extends through each stage. Phase electrodes lie on the insulating layer transversely to the channel. The semiconductor substrate under the phase electrodes is divided into barrier regions and adjacent well regions bounded by the channel. A dopant layer of a second-type conductivity lies in each of the well regions relatively near to the first surface. An enhanced first-type conductivity dopant layer lies in the well regions and the barrier regions relatively far from the surface having a doping which is greater than the doping of the first-type conductivity semiconductor substrate.

8 Claims, 23 Drawing Figures

CO-PLANAR WELL-TYPE CHARGE COUPLED DEVICE WITH ENHANCED STORAGE CAPACITY AND REDUCED LEAKAGE CURRENT

BACKGROUND OF THE INVENTION

This invention relates to semiconductor memories, and more particularly to charge coupled device memories (CCD) comprised of improved memory "cells" or "stages".

During the past several years, much time, effort, and money has gone into the development of high density, low cost memories. This is because the computer industry has continually demanded more and more storage capacity. As a result of this past memory development work, the number of stages per chip has increased from 16 to 64,000. In addition, the cost per stage has been decreased by a factor of approximately 200.

A popular architecture for the CCD memory is the serial-parallel-serial (SPS) organization. Information in the form of charge packets is serially loaded into a shift register. When the register is full, the charge packets are loaded in parallel into a first in-first out stack. The charge packets are then moved in parallel through column transfer channels within the stack. At the stack output, they are loaded in parallel into another shift register. The charge packets are then shifted serially into a detection device.

A major reason for the increase in the number of stages per chip has been the development of small, reliable memory cells. Thousands of these cells are formed on a single chip; and the chips are interconnected to form larger memories. By forming large numbers of memory cells in a chip, large economies in the cost per bit can result if reasonable yields are obtained. However, as the size of a chip increases, the yield decreases; so that the advantage of obtaining a large number of stages per chip by use of a larger chip size is outweighted by reduction in yields. Presently, chips of about 150-250 mils on a side are commonly made in the semiconductor industry. Accordingly, it is desirable to reduce the area occupied by each cell in order to further increase the number of stages per chip.

An important limitation of the prior art cells is that they all have less charge capacity per unit area than is desirable. A high charge capacity per unit area is desired because as the number of stages per chip increases, the size of each cell must necessarily decrease. Thus the amount of charge stored in each cell decreases. Eventually, a point is reached beyond which the cell cannot be reduced further because the amount of charge that the cell can store is indistinguishable from noise. Thus, charge capacity per unit area is a fundamental limitation on the minimum cell size.

Prior art cells are also deficient in a second parameter which is called leakage current. The leakage current is a measure of the quantity of electron-hole pairs that are thermally generated in a cell. These charge carriers are undesirable because they alter the amount of charge that is stored as information, and eventually they totally cancel the information charge. In order to avoid this cancelling effect, the information charge in the cell must be periodically "refreshed" at certain minimum time intervals. The refresh period is inversely proportional to the leakage current in the cell.

Because of these and other limitations in the prior art, and because of the demand for more cells of storage per chip, it is therefore an object of this invention to provide an improved charge coupled device memory.

It is another object of the invention to provide a charge coupled device memory comprised of stages having an increased storage capacity per unit area.

It is still another object of the invention to provide a charge coupled device memory comprised of stages having decreased leakage current while at the same time having increased storage capacity per unit area.

SUMMARY OF THE INVENTION

These and other objectives are accomplished in accordance with the invention by a charge coupled device memory comprised of an array of serial-parallel-serial memory blocks. Addressing means selectively addresses each of the blocks via address signals generated external to the memory. Means are provided for reading from and writing data into each of the selected blocks. Also, means are provided for controlling the reading and writing operations in response to control and clocking signals generated external to the memory. Each of the blocks is comprised of an N-stage serial-parallel charge coupled device register, an M X N-stage charge coupled device stack, an N-stage parallel-serial charge coupled device register. The stack has N inputs coupled in parallel to N outputs of the serial-parallel register. The stack also has N outputs coupled to N parallel inputs of the parallel-serial register. Thus, the block has a serial-parallel-serial charge transfer channel.

In one embodiment, each stage of the register and the stack includes a P-type semiconductor substrate having a first surface. An insulating layer of uniform thickness lies on the first surface. A charge transfer channel passes through each stage. At least two phase electrodes lie on the insulating layer transversely to the channel. The semiconductor substrate under each phase electrode is divided into a barrier region and an adjacent well region bounded by the channel. An N-type dopant layer lies in each of the well regions relatively near to the first surface. An enhanced P-type dopant layer in each of the well regions and the barrier regions lies relatively far from the first surface and has an acceptor doping which is greater than a doping of the P-type semiconductor substrate. In a second embodiment, all of the above structural features are included along with a buried channel dopant layer. The buried channel dopant layer lies in each of the well and barrier regions above the enhanced P-type dopant layer.

BRIEF DESCRIPTION OF THE DRAWINGS

The novel features believed characteristic of the invention are set forth in the appended claims; the invention itself, however, as well as other features and advantages thereof may best be understood by referring to the following detailed description of particular embodiments when read in reference to the accompanying drawings, wherein:

FIGS. 4b and 4c are potential diagrams illustrating the operation of the memory block stage shown in FIG. 4a;

FIG. 5 is a graph illustrating the relationship between gate to substrate voltage and surface potential in the stage of FIG. 4a;

FIG. 6 is a graph illustrating the relationship between several parameters of the stage of FIG. 4a;

FIG. 7 is a cross sectional view taken transversely to the charge transfer channel of the stage of FIG. 4a;

DETAILED DESCRIPTION OF SPECIFIC EMBODIMENTS

Figures 1, 1A:
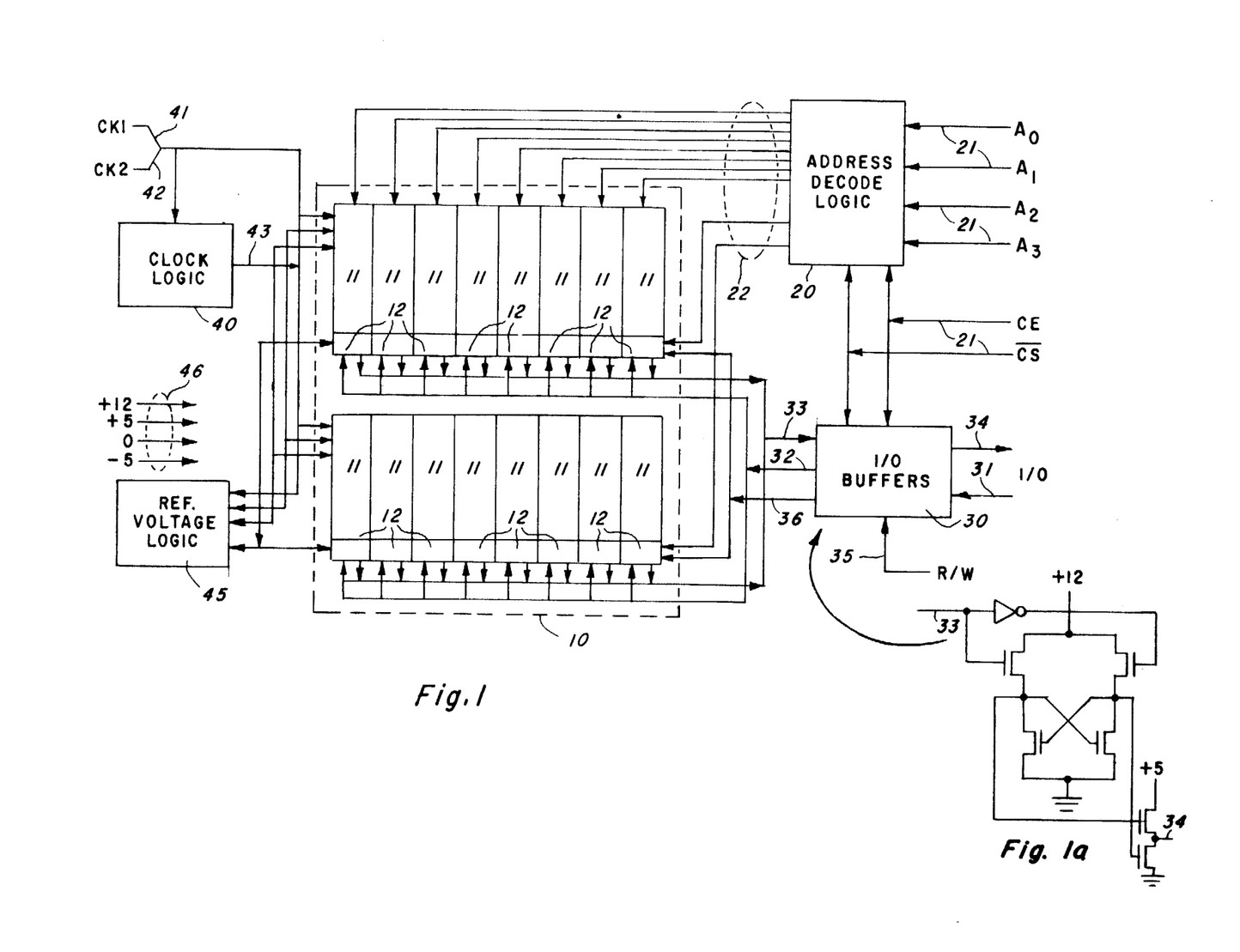
FIG. 1 is a block diagram of a semiconductor memory constructed according to the invention.
FIG. 1a is a circuit diagram of a signal buffering circuit which may be included in the input/output logic forming part of the memory illustrated in FIG. 1.

Referring to FIG. 1, a block diagram of a charge coupled device memory (CCD memory) constructed according to the invention is illustrated. This particular memory has a capacity of storing approximately 64,000 bits of binary information. The memory is implemented with charge coupled devices (CCDs), and is fabricated on a single semiconductor chip.

Basically, the CCD memory consists of a storage array 10, address decode logic 20, input/output logic 30, clock logic 40, and reference voltage logic 45. Power is supplied to these components via leads 46. Storage array 10 is basically comprised of sixteen serial-parallel-serial (SPS) memory blocks 11. Regeneration logic 12 is provided for each block. Each of the sixteen blocks has a capacity of storing 4,096 bits of binary information.

Address logic 20 selects one of the sixteen memory blocks 11 in response to address signals A0-A3, CE and $\overline{CS}$. The address logic may be implemented with previously described logic means, an example of which is described in IEEE Transactions on Electron Devices, Volume ED-23, pp. 117-126, February 1976. The address signals are generated external to the CCD memory, and are applied to the memory via leads 21. When signal CE is at a high voltage level and signal $\overline{CS}$ is at a low voltage level, address decode logic 20 is enabled. Decode logic 20 receives signals A0-A3 on leads 21, decodes the A0-A3 signals, and generates selection signals on leads 22. Leads 22 selectively couple to one memory block-regeneration logic pair, and the signals generated thereon are interpreted as selection signals.

Binary information is written into a selected SPS memory block in the following manner. A lead 31 couples to input/output logic 30, and binary information is applied to it from a source external to the CCD memory. Input/output logic 30 buffers the signal on lead 31 onto a lead 32. Lead 32 couples to an input of the regeneration logic for each of the SPS memory blocks, but signal on lead 32 is accepted only by the selected block. Any one of several regeneration structures may be used in conjunction with the memory blocks. An example of one such regeneration device is described in U.S. Pat. No. 3,979,603 issued to William M. Gosney on Sept. 7, 1976.

Similarly, binary information is read from a selected SPS memory block via leads 33 and 34. Lead 33 couples to an output of each of the SPS memory blocks through the regeneration logic 12. A selected block utilizes reference voltage signals formed by the reference voltage logic 45 to sense the selected bits and generate information signals on lead 33. Input/output logic 30 couples to lead 33 and buffers the signals on lead 33 onto lead 34. The buffered signals on lead 34 are sensed by logic external to the CCD memory. An example of one circuit used to buffer the signals on lead 33 is illustrated in FIG. 1a.

The above described write and read operation is further controlled by signals R/$\overline{W}$, CK1, and CK2. These signals are applied to the CCD memory via leads 35, 41, and 42 respectively. Lead 35 couples to input/output logic 30 and also drives a lead 36 which couples to the regeneration logic 12 of each block. A high voltage on lead 35 is interpreted as a read command, and a low voltage is interpreted as a write command. Leads 41 and 42 couple to each of the SPS memory blocks 11, and to clock logic 40. Clock logic 40 receives signals CK1 and CK2 on leads 41 and 42, and in response generates clock signals SP1, SP2, P1, P2, P3, P4, PS1, and PS2. These signals control the timing of charge-transfers within SPS memory blocks 11. Several leads 43 couple clock logic 40 to SPS memory blocks 11 and carry the generated clock signals.

An important novel aspect of the above described CCD memory lies in the structure of the cells within the SPS memory blocks 11. The novel structure increases the charge capacity per unit area of each memory cell within block 11. This is a highly desirable result because for a given cell surface area, the quantum of charge stored therein is easier to detect. Alternatively, a cell constructed according to the invention may be reduced in surface area and thereby increase the amount of memory on a given chip size. The novel structure also results in a lower leakage current. Thus, the time interval between refresh cycles may be increased.

Figure 2:
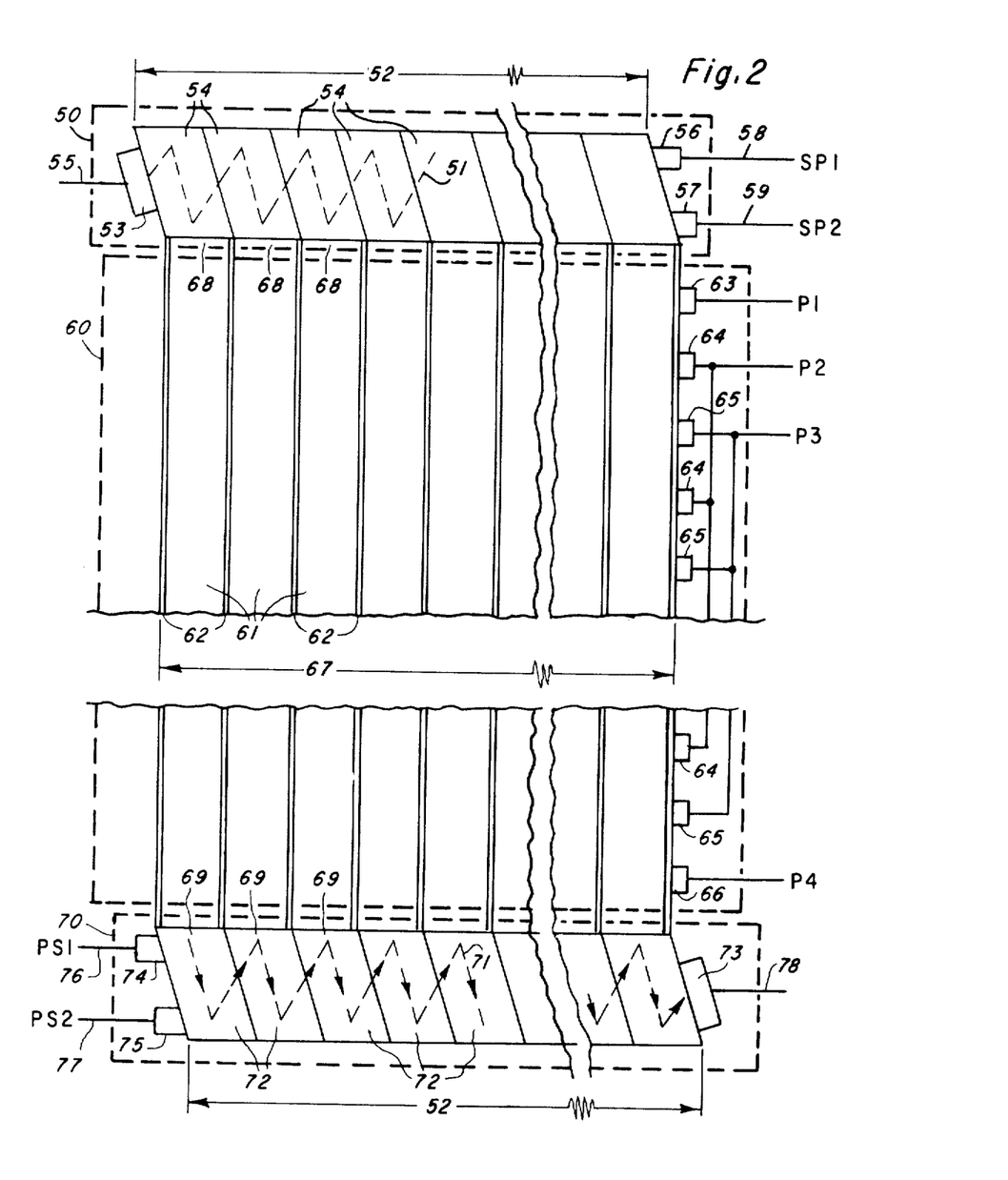
FIG. 2 is a block diagram illustrating in greater detail the structure of one of the memory blocks of FIG. 1.

Referring then to FIG. 2, a block diagram (not to scale) of an SPS memory block with incorporates the novel cells is illustrated. Basically, the memory block consists of an N-stage serial-parallel register 50, an M x N stage stack 60, and an N-stage parallel-serial register 70. Registers 50 and 70 have serial charge transfer paths 51 and 71 respectively. Stack 60 has parallel charge transfer paths 61. Transfer paths 51, 61, and 71 are comprised of memory cells constructed according to the invention, and which will be described in detail in conjunction with FIGS. 4a-9.

Serial-parallel register 50 is comprised of a charge input device 53, and N serially connected stages 54. Charge input device 53 has an input lead 55 for receiving data input signals. Device 53 generates charge packets, representing a "0" or "1", in response to input signals on lead 55. This charge is moved from stage to stage in a manner along charge transfer path 51. Each stage includes first and second phase serial transfer electrodes 56 and 57 to control the transfer of this charge. Leads 58 and 59 couple respectively to electrodes 56 and 57 of each stage. Clock signals SP1 and SP2 are applied to leads 58 and 59 respectively.

Stack 60 is comprised of a plurality of column channels 61 and column channel stops 62—the latter of which is illustrated as a double line. Each stage 54 of register 50 has an output region which couples to an input 68 of one of the column channels. The channels and channel stops alternate in parallel with each other, and are perpendicular to register 50. Stack 60 includes a serial-parallel transfer electrode 63, a plurality of first and second phase parallel transfer electrodes 64 and 65, and a parallel-serial transfer electrode 66 for moving charge through the column channels. These electrodes lie perpendicular to and extend across all of the channels. In addition, electrode 63 partially overlies the output region of stages 54 in register 50. Leads 67 couple to electrodes 63, 64, 65 and 66; and clock signals P1, P2, P3, P4 respectively are applied to these electrodes to control the charge movement.

Parallel-serial register 70 is comprised of N serially connected stages 72 and one charge detection device 73. Each stage 72 has an input region which couples to the output 69 of one column channel. Transfer electrode 66 partially overlies the input region of register 70. Each stage 72 includes first and second phase serial transfer electrodes 74 and 75 to control the transfer of charge through the register. Leads 76 and 77 couple respectively to electrodes 74 and 75; and clock signals PS1 and PS2 are applied thereto. Charge detection device 73 senses the presence or absence of charge representing a binary "1" or binary "0" in the last stage, and generates an output signal on a lead 78 reflecting the sensed charge level.

Figure 3:
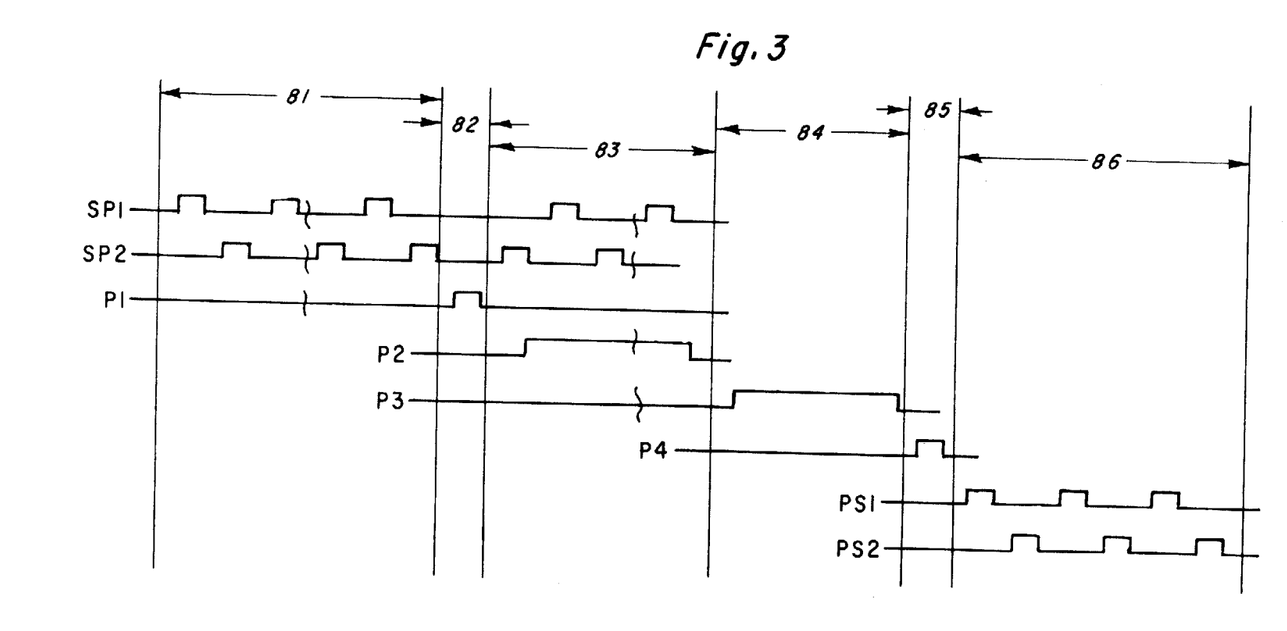
FIG. 3 is a timing diagram illustrating the operation of the memory block of FIG. 2.

Referring to FIG. 3, a timing diagram of SPS memory block 11 is illustrated. This diagram explains one sequence in which charge is moved through the components of the memory block.

During a time interval 81, input device 53 injects charge packets in response to sequential digital input signals on lead 55. Clocks SP1 and SP2 alternate to move these injected charge packets through the N stages of register 50. For an N-channel device, all the charge packets lie in potential wells under electrode 56 when clock SP1 is at a high voltage level and clock SP2 is low. Conversely, when clock SP1 is low and clock SP2 is high, the charge packets move into potential wells under electrodes 57. Thus, after N cycles of this SP1-SP2 clock sequence, each stage of register 50 has a charge packet stored in it.

During a time interval 82, clock signal P1 is at a high voltage level and the set of charge packets in register 50 moves in parallel from each stage of register 50 in to stack 60 under electrode 63. Clock signals SP1 and SP2 are both low during this time interval.

In a subsequent timing interval 83, clock signal P2 goes high and the charge packets under electrode 63 move under an adjacent electrode 64. Also, the SP1-SP2 clock sequence continues and register 50 begins to refill.

During another time interval 84, clock P2 is low and clock P3 is high, and the charge packets in stack 60 move under electrodes 65. Also, the SP1-SP2 clock sequence continues to refill register 50.

In another time interval 85, clock P4 is high and charge packets move under electrode 66 from under the adjacent electrode 65. Note that this is not the same set of charge packets that was moved from register 50 into stack 60 during the preceding timer interval 82. Timing intervals 83 and 84 must be repeated M times for one particular set of charge packets to progagate through stack 60. Also during timing interval 85, a new set of charge packets may be moved from register 50 into stack 60.

In still another time interval 86, clocks PS1 and PS2 are sequenced to move the charge packets into register 70 from under electrode 66, and then serially through register 70 into detection device 73. Also, the SP1-SP2 clock sequence continued to refill register 50.

Figure 4A:
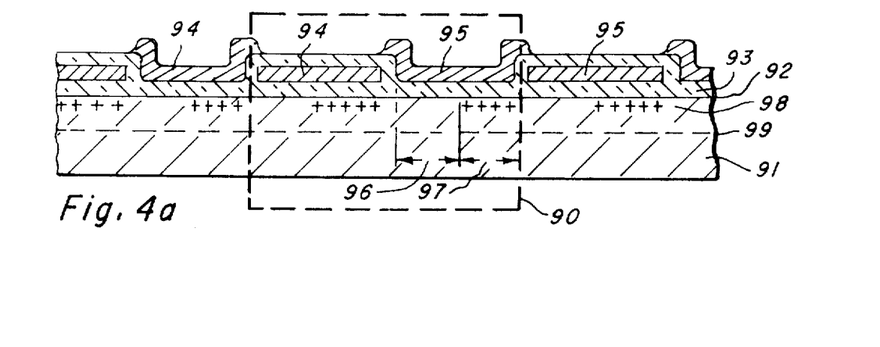
FIG. 4a is a cross sectional view illustrating the structure and operation of a stage of the memory block of FIG. 2.

The detailed structure of each cell or stage of the memory block of FIG. 2 will now be described in conjunction with FIG. 4a. FIG. 4a is a cross sectional view taken along the charge transfer paths 51, 61, or 71 of FIG. 2. A typical cell along these paths is illustrated in FIG. 4a by the structure enclosed within the dashed lines 90. As therein illustrated, each stage includes a P-type semiconductor substrate 91 having a first surface 92. An insulating layer 93 lies on top of surface 92. Two phase electrodes 94 and 95 lie on insulating layer 93 transversely to the charge transfer path through the stage. Phase electrodes 94 and 95 correspond to serial transfer electrodes 56 and 57 in serial-parallel register 50. Similarly, phase electrodes 94 and 95 correspond to parallel transfer electrodes 64 and 65 in stack 60. Also, phase electrodes 94 and 95 correspond to serial transfer electrodes 74 and 75 in parallel-serial register 70.

The semiconductor substrate under each phase electrode 94 and 95 is divided into a barrier region 96 and a well region 97. Region 96 lies adjacent to region 97. Both regions are bounded on their sides by charge transfer channel stops such as channel stops 62 of FIG. 2 as example. An N-type dopant layer 98 lies in each of the well regions 97 relatively near to first surface 92. In FIG. 4a, N-type dopant layer 98 is illustrated as a layer of plus signs representing an immobile positive charge which remains in substrate 91 when the mobile charges of dopant layer 98 have been depleted. Also according to the invention, an enhanced P-type dopant layer 99 lies within both the well region 96 and the barrier region 97. The enhanced P-type dopant layer 99 lies within substrate 91 at a distance relatively far from surface 92. The combination of N-type dopant layer 98 and enhanced P-type dopant layer 99 yields a surface channel charge coupled device having an increased depletion capacity and thus having an enhanced charge capacity. A detailed analysis of this enhanced charge capacity will be described shortly in conjunction with FIG. 5.

Figure 4B:
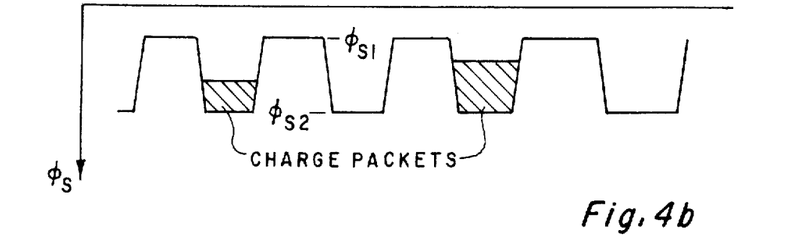
Figure 4C:
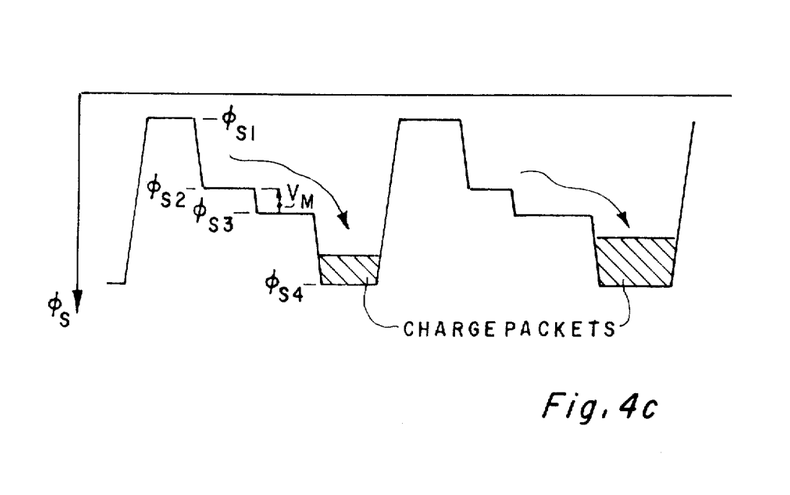

The manner in which charge packets are transferred from one stage to another is illustrated in FIGS. 4b and 4c. In particular, these figures illustrate the surface potential $\phi_s$ along the surface of the structure of FIG. 4a at two different time instants. In FIG. 4b, the clocking signals on phase electrodes 94 and 95 are off or at their resting potential, whereas in FIG. 4c the clocking signals on electrode 94 are on. When a clocking signal is off, the surface potential on the barrier region underlying the corresponding electrode is at a value $\phi_{s1}$, and the surface potential in the well region underlying the corresponding electrode is $\phi_{s2}$. Similarly, when a clocking signal is on, the surface potential in the underlying barrier region is $\phi_{s3}$, and the surface potential in the underlying well region is $\phi_{s4}$. For charge transfer to occur from under one electrode to an adjacent electrode, the surface potential $\phi_{s3}$ must be greater than the surface potential $\phi_{s2}$. This condition is evident from inspection of FIG. 4c. This condition however can easily be met for a variety of clock voltages, N-type dopant layer 98 charge densities and charge distributions, and enhanced P-type dopant layer 99 charge densities and charge distributions. This fact along with a description of the increased charge capacity of the respective stages will now be described in conjunction with FIG. 5.

Figure 5:
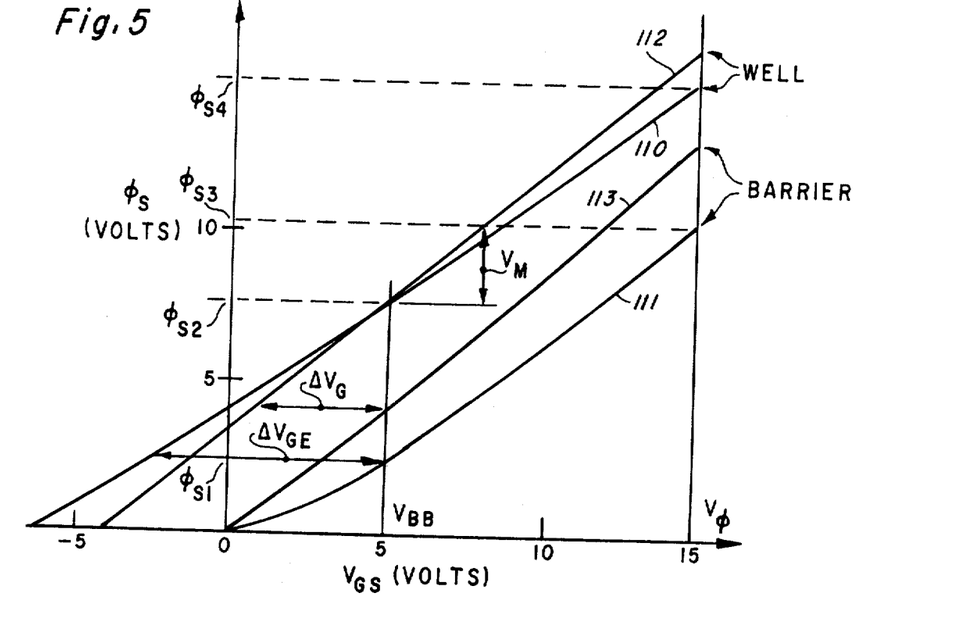

FIG. 5 illustrates surface potential in the well and barrier regions of the stage illustrated in FIG. 4a as a function of the gate to substrate voltage $v_{gs}$. In particular, curve 110 relates surface potential to $v_{gs}$ in the well region, while curve 111 relates surface potential to $v_{gs}$ in the barrier region. Also contained in FIG. 5 are curves 112 and 113 which relate surface potential to $v_{gs}$ for a structure similar to that of FIG. 4a but which contains no enhanced P-type dopant layer 99. Such a structure corresponds to conventional two phase CCD stages. As FIG. 5 illustrates, the effect of adding enhanced P-type dopant layer 99 in the barrier region 96 is to lower the surface potential in that region for any given gate to source voltage. The reduction in surface potential however is a non-linear function of $v_{gs}$. Note for example how curve 111 bends in the region where $v_{gs}$ varies between 0 and 5 volts. The enhanced P-type dopant layer 99 has a similar effect on surface potential in well region 97. As a result, curve 110 has a slope for any given surface potential which is similar to the slope of curve 111. Curve 110 however lies to the left of curve 111 due to the effect of N-type dopant layer 98. That is, in the well regions 97, the enhanced P-type dopant layer 99 lowers the surface potential as a function of $v_{gs}$ in a non-linear fashion, whereas N-type dopant layer 98 shifts the flatband voltage in a negative direction. FIG. 5 illustrates the surface potentials in a preferred embodiment wherein the density and depth of the enhanced P-type dopant layer 99 and N-type dopant layer 98 are such as to shift the flatband voltage of the well regions 97 in a negative direction by an amount in which the surface potential of the well region 97 at the resting phase voltage is substantially the same as if the stage had no enhanced P-type layer.

An analysis of the enhanced charge capacity of cell 90 will now be described. In general, charge capacity of a cell is a measure of the quantum of charge which can be stored in a well region 97. It has been shown that charge capacity equals a capacitance C times the gate to substrate voltage required to shift the surface potential of the well region to the surface potential of the barrier region. Referring to FIG. 5, this change in $v_{gs}$ is illustrated as $\Delta v_g$ for a cell not having an enhanced P-type dopant layer 99, and is illustrated as $\Delta v_{ge}$ for a cell having an enhanced P-type dopant layer 99. It is clear from this figure, that $\Delta v_{ge}$ is greater than $\Delta v_g$. This is because the enhanced P-type dopant layer 99 caused curves 110 and 111 to have a non-linear curvature as previously described and thus a gate to substrate voltage difference between the two curves for a given $\phi_s$ is increased.

In general, the curvature of curves 110 and 111 is increased as the density of P-type dopant layer 99 is increased. However, a limitation exists as to the extent to which the P-type dopant layer 99 charge density may be increased. This limitation is that the surface potential $\phi_{s3}$ must be greater than $\phi_{s2}$. As the charge density of P-type dopant layer 99 increases, $\phi_{s3}$ tends towards $\phi_{s2}$. Theoretically, charge stored in a potential well under one electrode may be transferred to that of a second phase electrode if the surface potential under the barrier region of the second electrode is greater than or equal to the surface potential in the well under the first electrode. However, a voltage margin $v_m$ is desired since it increases charge transfer efficiency and makes the device more easily reproducible.

A cell having increased charge storage capacity and having a voltage margin $v_m$ may be constructed according to FIG. 4a wherein the density and depths of the enhanced P-type dopant layer 99 and N-type dopant layer 98 have a wide range of values. For example, N-type dopant layer 98 may have a Gaussian distribution with a peak lying within 500 Å to 2000 Å from surface 92, and enhanced P-type dopant layer 99 may have a Gaussian distribution with a peak lying within 5000 Å to 15000 Å from surface 92. In this embodiment, the peak density of N-type dopant layer 98 is approximately $1.0-50 \times 10^{17}$ ions/cm$^3$ and the peak density of enhanced P-type dopant layer 99 is approximately $1.0-50 \times 10^{17}$ ions/cm$^3$. In an alternative embodiment, the enhanced P-type dopant layer 99 has a relatively uniform distribution extending from surface 92 to approximately 5000-15000 Å below surface 92. The dopant density of this uniform distribution is approximately $1.0-50 \times 10^{17}$ ions/cm$^3$.

Figure 6:
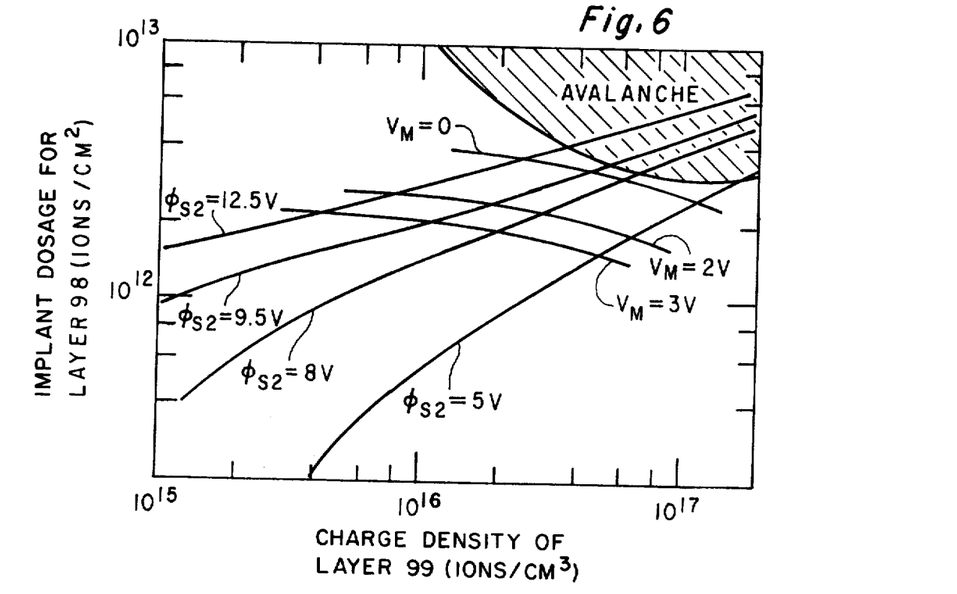

FIG. 6 is a plot illustrating the relationship between the charge density of the P-type dopant layer 99, the charge density of the N-type dopant layer 98, voltage margin $v_m$, and surface potential $\phi_{s2}$ for a structure wherein P-type dopant layer 99 has a uniform charge density and wherein the charge densities of P-type dopant layer 99 and N-type dopant layer 98 are such that the surface potential in the well region under a resting phase electrode is substantially the same as if the stage had no enhanced P-type layer. As was previously pointed out, a large charge density for P-type dopant layer 99 is desirable since it yields an increased charge capacity. However, as illustrated in FIG. 6, as the charge density of P-type dopant layer 99 is increased, the charge density of N-type dopant layer 98 must also be increased in order to maintain a constant empty well surface potential $\phi_{s2}$ under an off phase electrode. It is also clear from FIG. 6, that as the charge density of P-type dopant layer 99 increases, the voltage margin $v_m$ decreases. Still, increased storage capacity and an acceptable voltage margin $v_m$ can be achieved over a wide range of charge densities for P-type dopant layer 99 and N-type dopant layer 98.

Figure 7:
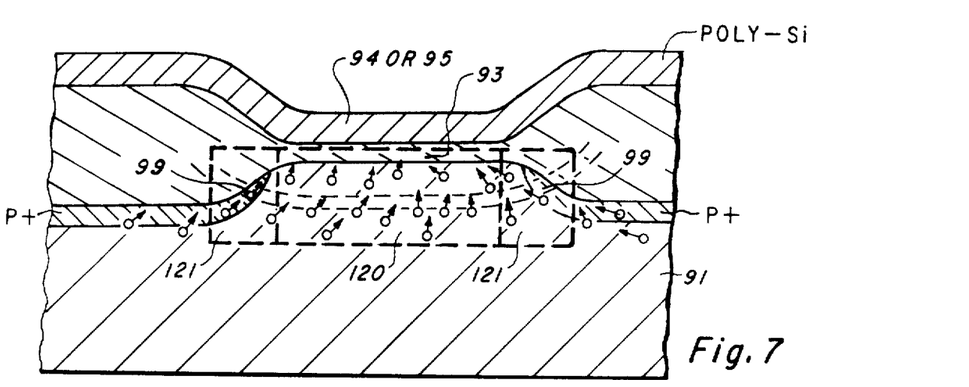

FIG. 7 is a cross sectional view of cell 90 taken across the charge transfer path. Also indicated in FIG. 7 are the sources of leakage charge generation. One of the sources is the depletion region under the phase electrodes. This region is indicated in FIG. 7 by the dashed lines 120. The amount of leakage current generated in depletion region 120 is proportional to the volume of the depletion region. The enhanced doping within the depletion region 120 due to P-type dopant layer 99 results in a decreased depletion volume which in turns results in reduced leakage charge.

A second source of leakage charge is a component that is generated under the thick field oxide regions which border the charge coupled device channel. These regions are indicated in FIG. 7 by the dashed lines 121. A finite depletion region exists within region 121. Further, the transition from the field oxide region to the gate oxide region is gradual, extending over approximately 5000 Å and this tapering produces a lateral grading in the surface potential resulting in an electric field which aids in the transport of the charge carriers in the field region to the storage well. By comparison, the structure disclosed herein has an enhanced P-type dopant layer 99 which extends into the tapered regions 121. Such a structure is achieved by implanting the P-type layer 99 at a relatively high energy such that some of the P-type ions penetrate directly into the tapered regions 121. In addition, the high energy implant causes the P-type ions to straggle laterally into the transition regions 121. As a result, an enhanced doping layer is formed in the tapered regions 121 which counteracts the surface potential grading in those regions due to the tapered oxide. In fact, the density and implant energy of the P-type dopant layer 99 can be chosen to actually reverse the field gradient within the tapered regions 121. As an example, a 250 Kev boron implant produces such a field gradient reversal. The enhanced capacity CCD stage 90 has a leakage current 2 to 8 times less than conventional charge coupled devices due to the structural aspects described herein.

Figure 8:
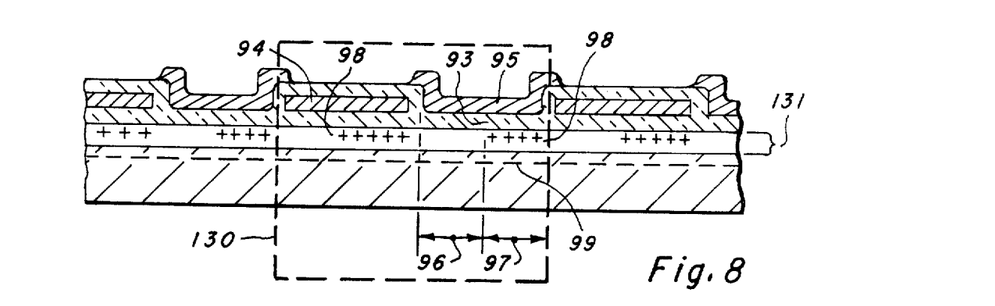
FIG. 8 is a cross sectional view of a stage constructed according to a second embodiment of the invention and suitable for use within the memory block of FIG. 2.

Referring now to FIG. 8, an alternative embodiment of a charge coupled device memory having stages constructed according to the invention is illustrated. This alternative embodiment is called an enhanced capacity buried channel charge coupled device stage. The dashed lines 130 outline the regions comprising one stage of the buried channel embodiment. Basically, the buried channel stage of FIG. 8 is similar in construction to the suface channel stage 90 of FIG. 4a, and further includes a buried channel dopant layer 131 of N-type conductivity in each of the well regions and barrier regions lying above the enhanced P-type dopant layer 99. In FIG. 8, the reference numerals 91-99 indicate those portions of the buried channel charge coupled device stage 130 which are similar in construction to portions of the surface channel stage 90 of FIG. 4a.

In one embodiment of the buried channel stage 130, the N-type dopant layer 98, the N-type buried channel dopant layer 131, and the enhanced P-type dopant layer 99 each have a Gaussian distribution. The peak of N-type dopant layer 98 lies within 500 Å–2000 Å from surface 92, and has a density of approximately $1.0–50 \times 10^{17}$ ions per $cm^3$. Similarly, the peak of N-type buried channel dopant layer 131 lies within 3,000 Å–10,000 Å from surface 92, and has a density of approximately $(0.5–50) \times 10^{16}$ ions/$cm^3$. Enhanced P-type dopant layer 99 has a peak lying within 5,000 Å–15,000 Å from surface 92, and has a maximum density of approximately $(1.0–50) \times 10^{17}$ ions/$cm^3$.

In an alternative embodiment of stage 130, the N-type buried channel layer 131 and enhanced P-type dopant layer 99 have a relatively uniform distribution. The uniform distribution of the N-type buried channel layer 131 extends from surface 92 to approximately 3,000 Å–10,000 Å below surface 92. The relatively uniform distribution of enhanced P-type dopant layer 99 extends from buried channel layer 131 to approximately 5,000 Å–15,000 Å below surface 92. The charge densities in the uniform distribution embodiment have approximately the same range as in the Gaussian distribution embodiment which was described above.

Figure 9:
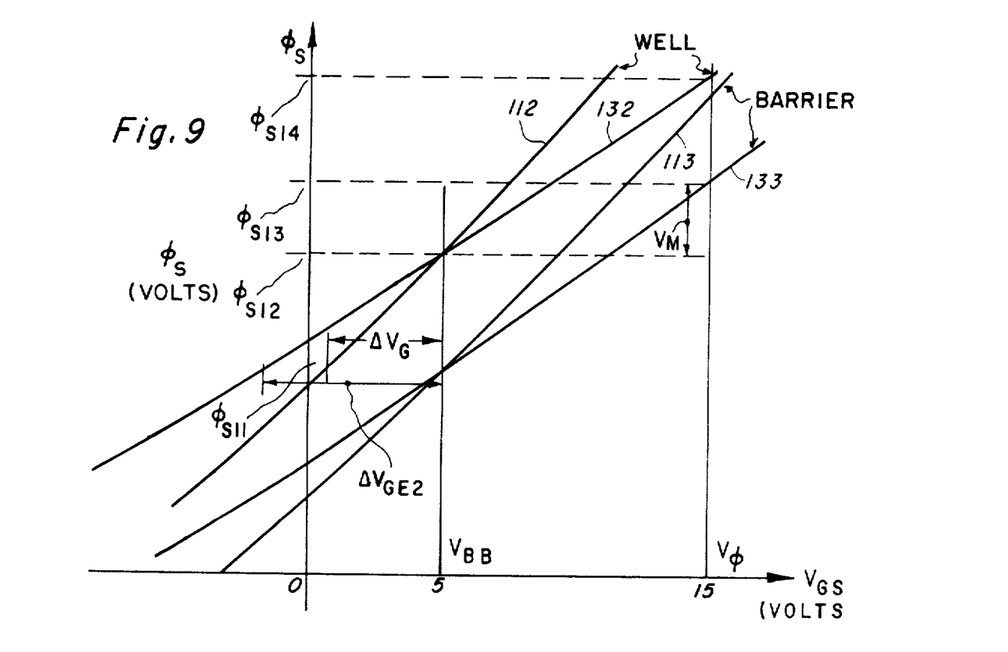
FIG. 9 is a graph illustrating the relationship between gate to substrate voltage and maximum channel potential in the stage of FIG. 8.

FIG. 9 is a graph illustrating the relationship between surface potential $\phi_s$ and gate to source voltage $V_{gs}$ for the buried channel stage 130. In particular, curve 132 relates surface potential to gate to source voltage in the well region 97 of stage 130, and curve 133 relates surface potential to gate to source voltage in the barrier region 96 of cell 130. As before, curves 112 and 113 are included to show the relationship between surface potential and gate to source voltage of a conventional two-phase charge coupled device.

Comparison of curves 132 and 133 with curves 112 and 113 indicates the effect of N-type dopant layer 98, N-type buried channel dopant layer 131, and enhanced P-type dopant layer 99 on the surface potential-gate voltage relationship. In particular, as was previously described in conjunction with the surface channel embodiment of FIG. 4a, the enhanced P-type dopant layer 99 causes the surface potential to be lower in a non-linear fashion with respect to gate voltage; and the N-type dopant layer 98 causes the flat band voltage to shift in a negative direction. Additionally, in the buried channel embodiment of FIG. 8, the N-type buried channel dopant layer 131 causes the flat band voltage in both the well region and storage region to shift in the negative direction. In a preferred embodiment, the density and depth of enhanced P-type dopant layer 99, N-type dopant layer 98, and N-type buried channel dopant layer 131 are chosen so as to shift the flat band voltage in the well and barrier regions in a negative direction such that the surface potentials of the well and barrier regions at the resting phase electrode voltage are substantially the same as if the stage 130 had no enhanced P-type layer 99. This condition is illustrated in FIG. 9 wherein it is apparent by inspection that the surface potentials in the barrier and well regions for a resting gate voltage are respectively $\phi_{s11}$ and $\phi_{s12}$ for the both the conventional and enhanced buried channel stage. This condition is readily achievable by utilizing various combinations of the above described charge densities and distributions.

FIG. 9 also indicates the charge capacity of cell 130 as compared to the charge capacity of a conventional cell. As previously stated, charge capacity may be expressed as a capacitance C which is a combination of oxide capacitance and depletion capacitance times the amount of gate voltage which is required to shift the maximum surface potential of the well region to the surface potential of the barrier region. With reference to FIG. 9, the maximum surface potential of the well region is indicated at $\phi_{s12}$; whereas the maximum surface potential of the barrier region is indicated at $\phi_{s11}$. Also as therein indicated, the gate to substrate voltage required to shift the surface potential of the well region from $\phi_{s12}$ to $\phi_{s11}$ is indicated as $\Delta V_{ge2}$. By comparison, the amount of gate to substrate voltage required to achieve the same surface potential shift in a conventional stage is indicated as $\Delta V_g$. It is clear from FIG. 9, that the quantity $\Delta V_{ge2}$ is greater than the quantity $\Delta V_g$. This is because the enhanced P-type dopant layer 99 causes curve 132 to bend in an unlinear fashion thereby increasing the voltage difference between curve 132 and 133 for any given surface potential. Utilizing the above described charge densities and distributions for layers 98, 99, and 131, charge capacity per unit area of buried channel stage 130 is increased by 25 to 55% over a conventional buried channel stage.

The enhanced capacity buried channel stage 130 also has decreased leakage current. The reasons for this decreased leakage current are the same as those previously described in conjunction with FIG. 7. That is, enhanced P-type dopant layer 99 creates a depletion region in the channel of the stage having a reduced area thereby decreasing the physical space in which electron hole pairs can be thermally generated. Also, in a preferred embodiment, enhanced P-type dopant layer 99 laterally lies under the perimeter of the channel sides thereby forming potential barriers in those areas. Accordingly, leakage current in the enhanced capacity cell 130 is two to eight times lower than leakage current in a conventional stage.

Referring now to FIGS. 10a-10e, the initial steps for building a stage according to the invention are illustrated. These figures are cross sectional views taken transversely to the charge transfer path as was illustrated in FIG. 7. The purpose of these initial steps is to form the perimeter of the stages (i.e., to define the charge transfer path). As a first step, a silicon dioxide layer 140 is formed on surface 92 of substrate 91. Layer 140 is approximately 1000 Å thick. It is formed by exposing the silicon substrate to an oxidizing atmosphere at approximately 1000° C. Next a silicon nitride layer 141 is formed on top of layer 140. Layer 141 is approximately 1000 Å thick; and it is formed by exposing the substrate 91 to an atmosphere containing silane and ammonia. Then a layer 142 of photoresist is deposited on top of the silicon nitride layer 141. The photoresist may be of a type called Kodak Metal Etch resist as an example.

Figure 10A:
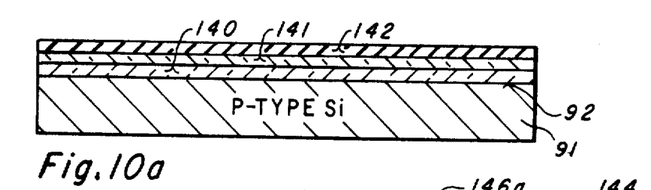
FIGS. 10a-10l are cross sectional views illustrating the process for constructing the stages of FIG. 4a and FIG. 8.
Figure 10B:
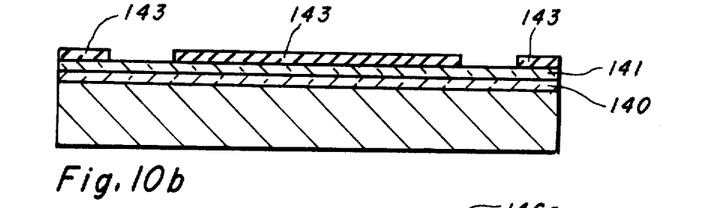

The next several steps form field oxide regions and corresponding channel stops alongside the stages. To this end, photoresist layer 142 is exposed to ultra-violet light through a mask having a pattern of the desired charge transfer path channel stop pattern. The photoresist is then developed leaving photoresist regions 143 as illustrated in FIG. 10b.

Figures 10C, 10E:
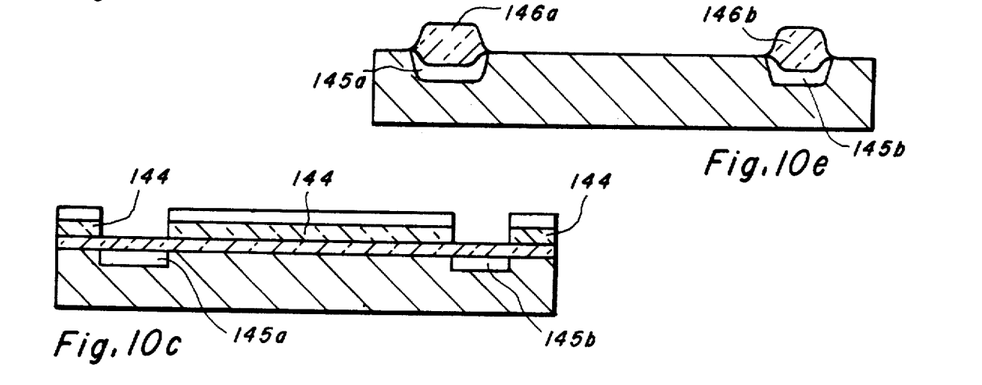

The slice is next subjected to a selective etchant (wet chemical, plasma, or ion mill) which will remove the silicon nitride in the areas where the photoresist has been removed. Thus, only areas 144 of the silicon nitride remain after this etching step. The result is illustrated in FIG. 10c. Next, a P-type implant is made through the exposed oxide layer to form channel stop regions 145a and 145b. These correspond to channel stops 62 of FIG. 2 for example. This implant step may be performed with boron ions at approximately 100 KeV. The dosage of these atoms is typically $(0.1-1.0) \times 10^{13}$ ions/cm$^2$.

Figure 10D:
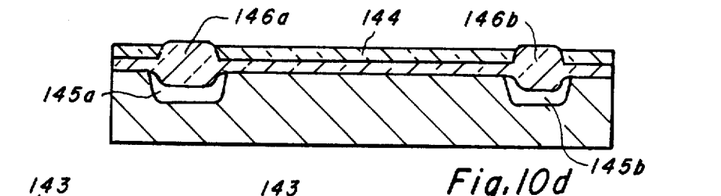

Next, photoresist regions 143 are removed by an appropriate clean-up step and then field oxide regions 146a and 146b are grown. The latter is performed by exposing the slice to an oxidation operation. The oxidation operation involves exposing the slice to steam at approximately 900°-1000° C. for several hours. During this operation, the nitride areas 144 mask the oxide layer 140 where the nitride areas 144 exist. The oxide that is formed during this process is approximately 3000 Å-10,000 Å thick. This oxide penetrates the surface of the silicon to a depth of approximately 1500-2500 Å. However, the P+ regions 145a and 145b are only partially consumed, and the remainder diffuse ahead of the oxidation front. The result of this operation is illustrated in FIG. 10d.

Then the nitride areas 144 are removed by an etchant, such as phosphoric acid. Next, oxide layer 140 is removed by another etchant, such as hydrogen fluoride. This completes the formation of the perimeter of the stage. The result is illustrated in FIG. 10e.

Figure 10F:
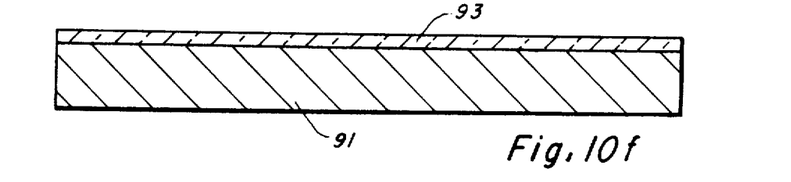

With reference to FIGS. 10f-10l, the remaining steps for constructing stages of a charge coupled device memory according to the invention will now be described. FIGS. 10f-10l are cross-sectional views taken parallel to one of the charge transfer paths 51, 61, or 71 of the memory block of FIG. 2. First, as shown in FIG. 10f, gate oxide layer 93 is formed on surface 92. The oxide layer 93 may be of any suitable thickness, and typically is 500 Å-1000 Å. Thermal oxidation may be used to form the oxide layer 93.

Figure 10G:
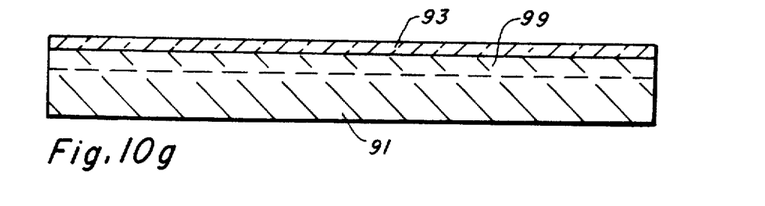

Next, enhanced P-type dopant layer 99 is implanted through oxide layer 93 into substate 91 throughout the channel regions. This step is illustrated in FIG. 10g. The charge density of layer 99 has a Gaussian distribution, with the distribution peak lying approximately 5000 Å-15000 Å from surface 92. The peak charge density of layer 99 is approximately $(0.5-50) \times 10^{16}$ ions/cm$^3$. In order that leakage current be reduced, the ions and implant energy are preferably chosen to lie within the perimeter of the channel stop regions, such as regions 121 of FIG. 7. As an example, boron ions at a implant energy of 250 KeV may be utilized to achieve this straggle effect. Note, that as an alternative, the steps of FIGS. 10f and 10g may be reversed in sequence. That is, enhanced P-type dopant layer 99 may be implanted directly into substrate 91 before gate oxide layer 93 is formed.

Figure 10H:
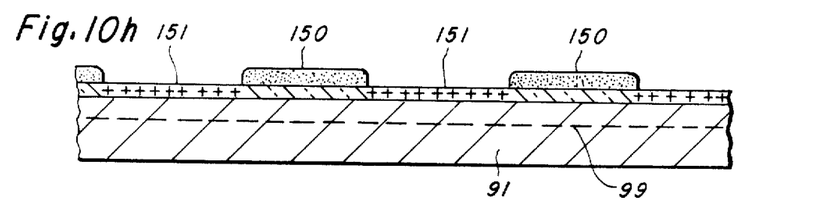

Using conventional photolithographic techniques, selected areas of the silicon oxide layer 93 are masked with spaced apart strips 150 of photoresist material which are defined along the length of the channel. N-type dopant ions, suitably arsenic, are then implanted into regions 151 of the silicon oxide layer 93 between the photoresist strips 150. Suitably, a beam energy of 55 KeV and dosage of $(1.0-50) \times 10^{16}$ ions/cm$^2$ may be used. It is important that the beam energy is sufficient to implant the ions into the silicon oxide layer 93 but not into the underlying surface areas of the substrate 91. Preferably the dopant ions selected for the implant are characterized by a small spread in penetration depth for the beam energy used so that a dense-layer of dopant ions is formed in each of the implanted silicon oxide areas; and the impurity ions have a relatively large diffusion coefficient in silicon oxide and a relatively low diffusion coefficient in silicon. The structure at this stage of the fabrication process is depicted in FIG. 10h.

Figure 10I:
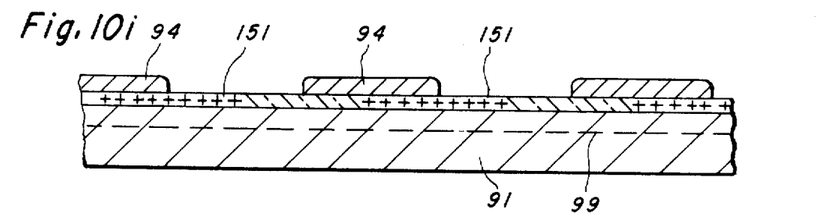

A layer of polycrystalline silicon is then deposited over the silicon oxide layer 93 and patterned by wet etching or plasma etching in offset aligned relation to the implanted oxide areas 151 as illustrated in FIG. 10i to define polycrystalline silicon strip electrodes 94 extending across the CCD channel in offset alignment relative to the implanted areas 151. A portion, (e.g. one-half) the length of each polycrystalline electrode 151 in the direction of the channel length overlies part of each implanted area 151. The polycrystalline silicon is deposited suitably at a temperature which is not high enough to result in any appreciable out-diffusion of impurities from the areas 151 into the underlying silicon substrate. A deposition temperature of 300°-800° C. may be used. The polycrystalline silicon layer may be doped during deposition to have a suitably high conductivity for providing of a good electrical conductor. Alternatively, it may be deposited undoped, and then doped by ion implantation. An N-type impurity such as phosphorus can be used with a beam energy of 90 KeV and a dose of $10^{15}$-$10^{16}$ ions/cm$^2$ into 4000 Å of polycrystalline silicon. This approach dopes the polycrystalline silicon while avoiding use of high temperature processing. In order to assist accurate alignment of the polycrystalline silicon electrodes 94, alignment markers in the silicon oxide layer 93 may be used.

Figure 10J:
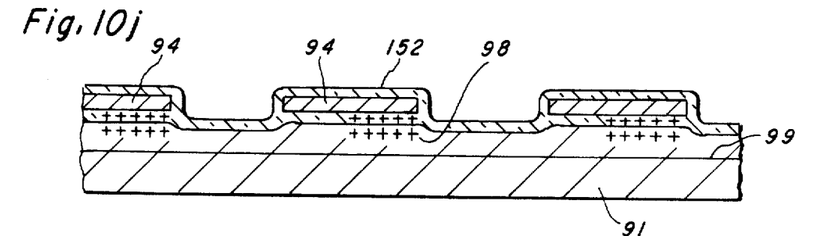
Figure 10K:
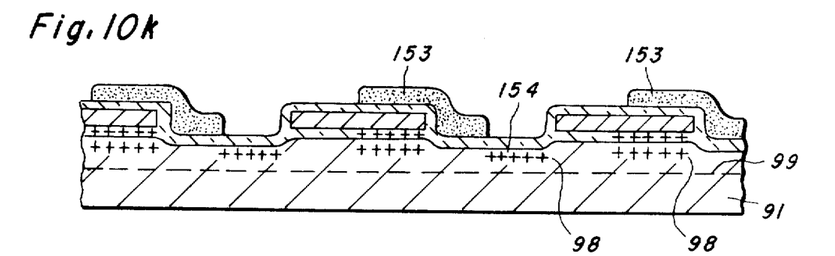

With reference to FIG. 10j, the silicon oxide areas between the electrodes 94 are then eteched preferably using a wet etching process, to expose the underlying surface areas of the substrate 91. In this manner, self-alignment of the implanted areas with respect to the edge of the polycrystalline electrodes is achieved. This is an important feature in order to achieve good CCD charge transfer efficiency. If self-alignment were not achieved, stray potential wells and barriers could result which would degrade the CCD transfer efficiency.

Fresh silicon oxide is then formed, preferably using a thermal growth process, over the substrate surface areas between the electrodes 94. This results in silicon oxide areas having the same thickness as the silicon oxide layers beneath the polycrystalline silicon electrodes 94 and thus layer 93 is reformed. This oxide formation step also results in a layer 152 of silicon oxide covering the surface areas of the polycrystalline silicon electrodes 94. The temperature used to form this silicon oxide layer can be selected such that diffusion of the N-type dopant ions occurs out of the oxide areas 151 into the underlying surface areas 98 of the substrate. Alternatively, an additional high temperature process step may be employed to achieve this diffusion. The diffusion step temperature may be 900°-1100° C. To aid in this diffusion step, the dopant impurities preferably are selected to have a relatively high diffusion coefficient in silicon oxide and a relatively low diffusion coefficient in silicon.

A layer of photoresist is then formed over the structure shown in FIG 10j and patterned to define photoresist areas 153. Each photoresist area 153 covers part (e.g. one-half) of the channel lying between electrodes 94 and part of electrode 94. The uncovered areas of the silicon oxide regions define the well regions which will lie under electrodes 95 in the completed structure. N-type dopant ions are then implanted into the unmasked portions of the silicon oxide regions. For example, phosphorus ions and an implant energy of about 150 keV and a dosage of $1.3 \times 10^{12}$ cm$^2$ may be used. The structure is then subjected to a heat treatment, suitably in the range 800°-1000° C., to electrically diffuse the ions into substrate regions 98. Alternatively, layer 98 under electrodes 95 may be implanted directly into substrate 91 through oxide layer 93.

Figure 10L:
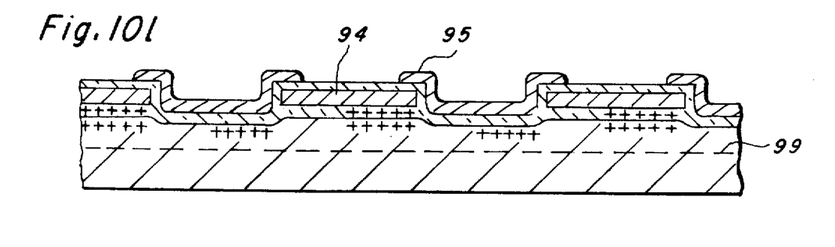

Photoresist areas 153 are then removed and a conductive layer, which may be a metal layer, e.g., aluminum, or a conductive semiconductor layer, e.g., polycrystalline silicon, is then formed over the structure and patterned to define electrodes 95 extending across the width of the channel between the polycrystalline silicon electrodes 94. Electrodes 95 having margins which overlap the edges of adjacent ones of the electrodes 94 are shown in FIG. 10l. Typically, gate lengths of 0.2-0.5 mils may readily be achieved using this process.

The process described with reference to FIGS. 10f-10l can be used to construct a buried channel CCD as well as a surface channel CCD. In order to provide a buried channel CCD structure, an N-type dopant implant is formed after the enhanced P-type dopant layer 99 is formed via the step FIG. 10g. The same mask may be used to form layer 99 and the buried channel. The remainder of the process steps are unchanged except that the N-type layers 98 would be at the interface of the buried channel layer and the silicon oxide layer.

The process described with reference to FIGS. 10f-10l can also be modified to construct either a surface channel or a buried channel CCD by utilizing epitaxial growth techniques. In order to construct a surface channel device using epitaxial growth techniques, an enhanced P-type dopant layer is grown on the surface of substrate 91 having a relatively uniform distribution and being approximately 5000 Å-15,000 Å thick. This enhanced P-type dopant layer is grown throughout the channel regions only. Typically, the epitaxial growth occurs at a temperature of 1000°-1200° C. in a gas of silicon tetrachloride or silane. Dopants are introduced through a carrier gas and the dopant density is controlled by the partial pressure of the carrier gas. A boron dopant for example may be introduced through a carrier gas of $B_2H_6$. A uniform density of approximately $(1.0-50) \times 10^{17}$ ions/cm$^3$ may suitably be obtained utilizing this process. After the enhanced P-type dopant layer is formed, the channel stop regions are formed by performing the steps described in conjunction with FIGS. 10a-10e. Then, electrodes 94 and 95 are formed by performing the steps described in conjunctions with FIGS. 10h-10l.

In order to form a buried channel CCD device utilizing epitaxial growth techniques, an enhanced P-type dopant layer is formed in the channel regions as described above. Next, a buried channel layer is formed in the channel regions on top of the enhanced P-type dopant layer. This buried channel dopant layer has a relatively uniform distribution of approximately $(0.5-50) \times 10^{16}$ ions/cm$^3$, and is approximately 3000 Å-10,000 Å thick. A phosphorus dopant for example may be introduced through a carrier gas of $PH_3$. Next, the channel stops are formed as described in conjunction with FIGS. 10a-10e; and then electrodes 94 and 95 are formed as previously described in conjunction with FIGS. 10h-10l.

It should be noted, that an alternative approach to increasing charge coupled device storage capacity and decreasing leakage current in view of what has been described above, may seem to simply choose substrate material with a higher doping. However, one reason why it is undesirable to have a higher substrate doping throughout the entire substrate is that the threshold voltage of peripheral circuitry on the chip will become too high. Another reason is that the body effect (threshold voltage dependence on back gate bias) is too large. Still another reason is that junction capacitances and channel stop capacitances are increased which limits the speed of the peripheral circuitry. Accordingly, an enhanced P-type dopant layer which lies throughout the charge transfer channel but does not increase the substrate doping external to the channel is a much more attractive approach to increasing charge capacity and decreasing leakage current in a CCD structure.

Various embodiments of the invention have now been described in detail. Also, many changes and modifications can be made in the above described details without departing from the nature and spirit of the invention. For example, P-channel devices as well as the above N-channel devices may be constructed. In order to construct a P-channel device, N-type material is substituted for P-type material, and vice versa. Charge distributions and charge densities remain essentially as described above.

As another modification, the number of phase electrodes per stage may be increased. For example, each stage may include three or four phase electrodes. As still another modification of the above details, the charge coupled device memory may have an architecture which includes a charge transfer path other than a serial-parallel-serial charge transfer path. In fact, a straight serial charge transfer path may be utilized. In that case, the structure would be a charge coupled device register having enhanced charge storage capacity and reduced leakage current. Since many changes and modifications can be made in the above-described details without departing from the nature and spirit of the invention, it is understood that the invention is not limited to said details except as set forth in the appended claims.

What is claimed is:

1. A charge device comprising:
a substrate of semiconductor material having a dopant impurity of P-type conductivity, said substrate having a first surface;
a body of insulating material disposed on said first surface of said substrate;
means defining a surface charge transfer channel in said substrate lying along said first surface of said substrate;
first and second spaced apart phase electrodes overlying said surface channel in transverse relation thereto and arranged with respect to said body of insulating material so as to provide a layer of insulating material of uniform thickness between each of said phase electrodes and said first surface of said substrate;
spaced relatively shallow regions having a dopant impurity of N-type conductivity lying near said first surface of said substrate, each of said relatively shallow N-type conductivity regions extending beneath a corresponding one of said first and second phase electrodes and being respectively aligned adjacent one edge thereof but terminating short of the opposite edge of the electrode corresponding thereto;
said substrate under each of said first and second phase electrodes being divided into a barrier region and an adjacent well region, said well region including a respective shallow region of said N-type conductivity therein;
an enhanced relatively deep layer having a dopant impurity of P-type conductivity and of greater concentration than the P-type conductivity dopant impurity in the semiconductor material of said substrate disposed within said substrate at a depth spaced from said first surface and extending through said barrier regions and said well regions beneath said first and second phase electrodes; and
the N-type conductivity dopant impurity of each of said relatively shallow N-type conductivity regions having a Gaussian distribution with a peak lying within 500 Å–2000 Å from said first surface of said substrate, and the P-type conductivity dopant impurity of said enhanced relatively deep P-type conductivity layer having a Gaussian distribution with a peak lying within 5000 Å–15,000 Å from said first surface.

2. A charge coupled device as set forth in claim 1, wherein the N-type conductivity dopant impurity of each of said relatively shallow N-type conductivity regions has a peak density of approximately $(1.0-50) \times 10^{17}$ ions/cm$^3$, and the P-type conductivity dopant impurity of said enhanced relatively deep P-type conductivity layer has a peak density of approximately $(1.0-50) \times 10^{17}$ ions/cm$^3$.

3. A charge coupled device comprising:
a substrate of semiconductor material having a dopant impurity of P-type conductivity, said substrate having a first surface;
a body of insulating material disposed on said first surface of said substrate;
means defining a surface charge transfer channel in said substrate lying along said first surface of said substrate;
first and second spaced apart phase electrodes overlying said surface channel in transverse relation thereto and arranged with respect to said body of insulating material so as to provide a layer of insulating material of uniform thickness between each of said phase electrodes and said first surface of said substrate;
spaced relatively shallow regions having a dopant impurity of N-type conductivity lying near said first surface of said substrate, each of said relatively shallow N-type conductivity regions extending beneath a corresponding one of said first and second phase electrodes and being respectively aligned adjacent one edge thereof but terminating short of the opposite edge of the electrode corresponding thereto;
said substrate under each of said first and second phase electrodes being divided into a barrier region and an adjacent well region, said well region including a respective shallow region of said N-type conductivity therein; and
an enhanced relatively deep layer having a dopant impurity of P-type conductivity and of greater concentration than the P-type conductivity dopant impurity in the semiconductor material of said substrate disposed within said substrate at a depth spaced from said first surface and extending through said barrier regions and said well regions beneath said first and second phase electrodes, the P-type conductivity dopant impurity of said enhanced relatively deep P-type conductivity layer having a relatively uniform distribution extending from said first surface of said substrate to approximately 5000 Å–15,000 Å below said first surface.

4. A charge coupled device as set forth in claim 3, wherein the density of the relatively uniformly distributed P-type conductivity dopant impurity of said enhanced relatively deep P-type conductivity layer is approximately $(1.0-50) \times 10^{17}$ ions/cm$^3$.

5. A charge coupled device comprising:
a substrate of semiconductor material having a dopant impurity of P-type conductivity, said substrate having a first surface;
a body of insulating material disposed on said first surface of said substrate;
means defining a charge transfer buried channel layer having a dopant impurity of N-type conductivity in said substrate lying adjacent to said first surface of said substrate;
first and second spaced apart phase electrodes overlying said buried channel layer in transverse relation thereto and arranged with respect to said body of insulating material so as to provide a layer of insulating material of uniform thickness between each of said phase electrodes and said first surface of said substrate;
spaced relatively shallow regions having a dopant impurity of N-type conductivity lying near said first surface of said substrate, each of said relatively shallow N-type conductivity regions extending beneath a corresponding one of said first and second phase electrodes and being respectively aligned adjacent one edge thereof but terminating short of the opposite edge of the electrode corresponding thereto;

said substrate under each of said first and second phase electrodes being divided into a barrier region and an adjacent well region, said well region including a respective shallow region of said N-type conductivity therein;

said buried channel layer extending through said barrier regions and said well regions, each of said relatively shallow regions of said N-conductivity lying within said buried channel layer;

an enhanced relatively deep layer having a dopant impurity of P-type conductivity and of greater concentration than the P-type conductivity dopant impurity in the semiconductor material of said substrate disposed within said substrate at a depth spaced from said first surface and extending through said barrier regions and said well regions beneath said first and second phase electrodes; and the N-type conductivity dopant impurity of each of said relatively shallow N-type conductivity regions having a Gaussian distribution with a peak lying within 500 Å–2000 Å from said first surface of said substrate, the N-type conductivity dopant impurity of said N-type conductivity buried channel layer having a Gaussian distribution with a peak lying within 3000 Å–10,000 Å from said first surface, and the P-type conductivity dopant impurity of said enhanced relatively deep P-type conductivity layer having a Gaussian distribution with a peak lying within 5000 Å–15,000 Å from said first surface.

6. A charge coupled device as set forth in claim 5, wherein the N-type conductivity dopant impurity of each of said relatively shallow N-type conductivity regions has a peak density of approximately $(1.0–50) \times 10^{17}$ ions/cm$^3$, the N-type conductivity dopant impurity of said N-type conductivity buried channel layer has a peak density of approximately $(0.5–50) \times 10^{16}$ ions/cm$^3$, and the P-type conductivity dopant impurity of said enhanced relatively deep P-type conductivity layer has a peak density of approximately $(1.0–50) \times 10^{17}$ ions/cm$^3$.

7. A charge coupled device comprising:

a substrate of semiconductor material having a dopant impurity of P-type conductivity, said substrate having a first surface;

a body of insulating material disposed on said first surface of said substrate;

means defining a charge transfer buried channel layer having a dopant impurity of N-type conductivity in said substrate lying adjacent to said first surface of said substrate;

first and second spaced apart phase electrodes overlying said buried channel layer in transverse relation thereto and arranged with respect to said body of insulating material so as to provide a layer of insulating material of uniform thickness between each of said phase electrodes and said first surface of said substrate;

spaced relatively shallow regions having a dopant impurity of N-type conductivity lying near said first surface of said substrate, each of said relatively shallow N-type conductivity regions extending beneath a corresponding one of said first and second phase electrodes and being respectively aligned adjacent one edge thereof but terminating short of the opposite edge of the electrode corresponding thereto;

said substrate under each of said first and second phase electrodes being divided into a barrier region and an adjacent well region, said well region including a respective shallow region of said N-type conductivity therein;

said buried channel layer extending through said barrier regions and said well regions, each of said relatively shallow regions of said N-type conductivity lying within said buried channel layer;

an enhanced relatively deep layer having a dopant impurity of P-type conductivity and of greater concentration than the P-type conductivity dopant impurity in the semiconductor material of said substrate disposed within said substrate at a depth spaced from said first surface and extending through said barrier regions and said well regions beneath said first and second phase electrodes; and the N-type conductivity dopant impurity of said N-type conductivity buried channel layer having a relatively uniform distribution extending from said first surface of said substrate to approximately 3000 Å–10,000 Å below said first surface, and the P-type conductivity dopant impurity of said enhanced relatively deep P-type conductivity layer having a relatively uniform distribution extending from said N-type conductivity buried channel layer to approximately 5000 Å–15,000 Å below said first surface.

8. A charge coupled device as set forth in claim 7, wherein the density of the relatively uniformly distributed N-type conductivity dopant impurity of said N-type buried channel layer is approximately $(0.5–50) \times 10^{16}$ ions/cm$^3$, and the density of the relatively uniformly distributed P-type conductivity dopant impurity of said enhanced relatively deep P-type conductivity layer is approximately $(1.0–50) \times 10^{17}$ ions/cm$^3$.

* * * * *